United States Patent
Nishimura et al.

(10) Patent No.: US 6,756,165 B2
(45) Date of Patent: Jun. 29, 2004

(54) RADIATION SENSITIVE RESIN COMPOSITION FOR FORMING BARRIER RIBS FOR AN EL DISPLAY ELEMENT, BARRIER RIB AND EL DISPLAY ELEMENT

(75) Inventors: Isao Nishimura, Chuo-ku (JP); Masayoshi Suzuki, Chuo-ku (JP); Masayuki Endo, Chuo-ku (JP)

(73) Assignee: JSR Corporation, Tokyo (JP)

( * ) Notice: Subject to any disclaimer, the term of this patent is extended or adjusted under 35 U.S.C. 154(b) by 78 days.

(21) Appl. No.: 09/840,130

(22) Filed: Apr. 24, 2001

(65) Prior Publication Data

US 2001/0044075 A1 Nov. 22, 2001

(30) Foreign Application Priority Data

Apr. 25, 2000 (JP) ........................................ 2000-123586
Sep. 8, 2000 (JP) ........................................ 2000-273214

(51) Int. Cl.[7] .............................. G03F 7/26; G03F 7/022
(52) U.S. Cl. ...................... 430/11; 430/311; 430/280.1; 430/14; 430/18
(58) Field of Search ........................................ 430/311

(56) References Cited

U.S. PATENT DOCUMENTS

| | | | | |
|---|---|---|---|---|
| 4,485,167 A | * | 11/1984 | Briney et al. ............. 430/281.1 |
| 5,368,976 A | | 11/1994 | Tajima et al. ............... 430/176 |
| 5,368,991 A | | 11/1994 | Uchikawa et al. ......... 430/288.1 |
| 5,418,094 A | | 5/1995 | Sato et al. ....................... 430/7 |
| 5,484,314 A | * | 1/1996 | Farnworth .................... 445/24 |
| 5,701,055 A | * | 12/1997 | Nagayama et al. .......... 313/504 |
| 5,958,648 A | | 9/1999 | Nishimura et al. |
| 6,001,533 A | | 12/1999 | Sega et al. ................ 430/270.1 |
| 6,013,415 A | | 1/2000 | Sakurai et al. ............. 430/281.1 |
| 6,040,117 A | | 3/2000 | Ota et al. .................... 430/311 |
| 6,051,368 A | | 4/2000 | Masuko et al. .......... 430/288.1 |
| 6,120,975 A | * | 9/2000 | Tokai et al. ................. 430/321 |
| 6,132,937 A | * | 10/2000 | Suzuki ....................... 430/325 |
| 6,197,480 B1 | * | 3/2001 | Iguchi et al. ................. 430/28 |
| 6,268,112 B1 | * | 7/2001 | Satou ....................... 430/284.1 |
| 6,306,559 B1 | * | 10/2001 | Tanamura et al. .......... 430/315 |
| 6,326,125 B1 | * | 12/2001 | Kakinuma et al. .......... 430/321 |
| 6,342,322 B1 | * | 1/2002 | Kakinuma et al. ............ 430/17 |
| 6,482,575 B2 | * | 11/2002 | Tokai et al. ................. 430/321 |
| 2002/0047560 A1 | * | 4/2002 | Lee et al. ................. 315/169.3 |

FOREIGN PATENT DOCUMENTS

| | | | |
|---|---|---|---|
| EP | 0 359 934 | | 3/1990 |
| EP | 0 564 168 | | 10/1993 |
| EP | 0 732 868 | | 9/1996 |
| EP | 0 875 788 | | 11/1998 |
| EP | 0 881 541 | | 12/1998 |
| EP | 0 902 327 | | 3/1999 |
| EP | 0 915 381 | | 5/1999 |
| JP | 2-66873 | | 3/1990 |
| JP | 5-258859 | | 10/1993 |
| JP | 5-258860 | | 10/1993 |
| JP | 5-275172 | | 10/1993 |
| JP | 8-315981 | | 11/1996 |
| JP | 2000-286057-a | * | 10/2000 ........... H05B/33/22 |
| JP | 2001-15267-a | * | 1/2001 |
| WO | WO 00/04421 | | 1/2000 |

OTHER PUBLICATIONS

"Form", from The American Heritage Dictionary, Second College Edition, Houghton Mifflin Company, Boston, MA, 1982, pp. 525–526.*

* cited by examiner

Primary Examiner—Cynthia Hamilton
(74) Attorney, Agent, or Firm—Oblon, Spivak, McClelland, Maier & Neustadt, P.C.

(57) ABSTRACT

A barrier rib for an EL display element. The rib is formed from the radiation sensitive resin composition containing (A) an alkali soluble resin, (B) a polymerizable compound having an ethylenically unsaturated bond, and (C) a radiation sensitive polymerization initiator.

10 Claims, No Drawings

RADIATION SENSITIVE RESIN COMPOSITION FOR FORMING BARRIER RIBS FOR AN EL DISPLAY ELEMENT, BARRIER RIB AND EL DISPLAY ELEMENT

DETAILED DESCRIPTION OF THE INVENTION

1. Field of the Invention

The present invention relates to a radiation sensitive resin composition for forming barrier ribs for an EL display element, barrier rib and EL display element. More specifically, it relates to a radiation sensitive resin composition suitable for use as a material for forming barrier ribs for an EL display element, a barrier rib formed therefrom and an EL display element comprising the same.

2. Prior Art

Generally speaking, the micro-patterning of the cathode and organic EL medium layer of an organic EL element is difficult because the heat resistance (generally 100° C. or lower), solvent resistance and moisture resistance of an organic EL medium used in a charge injection layer and light emitting layer are low. For example, when photolithography generally used for the patterning of a thin film is used for an organic EL element, deterioration in the characteristic properties of the organic EL element are caused by the permeation of a solvent contained in a photoresist into the organic EL element, high-temperature atmosphere during the baking of the photoresist, the permeation of a photoresist developer or etching solution into the organic EL element, or the damage of the organic EL element by plasma during dry etching.

Patterning may be carried out using a deposition mask. However, a fine pattern cannot be formed due to such problems that a short circuit occurs between an anode and a cathode made from indium tin oxide (to be abbreviated as ITO hereinafter) by the entry of a deposited product between a substrate and a mask caused by poor adhesion between the substrate and the deposition mask or the organic EL medium layer scratched by its contact with the mask when the substrate and deposition mask are forcedly brought into close contact with each other and that the mask bends due to its insufficient strength when the openings of a striped pattern for the cathode are large and the mask portion is a fine pattern.

To solve the above problems, for example, JP-A 2-66873 (the term "JP-A" as used herein means an "unexamined published Japanese patent application") discloses a method for patterning a photoresist comprising a solvent which does not dissolve an organic EL medium on the organic EL element and etching a cathode using dilute sulfuric acid. However, the organic EL medium is damaged by diluted sulfuric acid during etching.

JP-A 5-275172, JP-A 5-258859 and JP-A 5-258860 disclose a patterning method in which having a sectional shape of normally tapered barrier ribs and having a height of several to several tens of micrometers which are arranged on a substrate in parallel to one another are formed after ITO patterning and an organic EL medium and a cathode material are deposited on the substrate from a direction perpendicular to the barrier ribs and an oblique direction with respect to the surface of the substrate for patterning. That is, there is used a method such that a first electrode line and an thin film of the organic EL medium are selectively formed by oblique vacuum deposition by intercepting a predetermined gas stream with high barrier ribs at boundaries formed on the substrate to prevent spaces defined by the barrier ribs from being polluted during deposition. However, this oblique deposition method has such a defect that the brightness of a display element becomes insufficient due to the formation of an organic EL medium free portion in an opening between barrier ribs. JP-A 8-315981 overcomes the above defect of oblique deposition by using barrier ribs having an overhung sectional form (trapezoidal form having a shorter bottom side than a top side) to make possible vacuum deposition from above. However, as the formed barrier ribs are transparent, light emitted from the organic EL element passes through the barrier ribs, thereby making it difficult to prevent a reduction in the contrast of emitted light. General resist materials may have such problems that they cannot retain an inversely tapered form due to softening at the time of curing because they have low heat resistance and that when a volatile component from the material of the barrier ribs is contained in the EL layer as an impurity, the light emission area of the EL emission element reduces or a lighting failure occurs.

SUMMARY OF THE INVENTION

It is therefore an object of the present invention which has been made in view of the above situation to provide a radiation sensitive resin composition for forming barrier ribs for an EL display element which have required heat resistance, adhesion and an inversely tapered form.

It is another object of the present invention to provide a radiation sensitive resin composition for forming barrier ribs for an EL display element which further have light screening properties to prevent a reduction in contrast, required heat resistance, adhesion and an inversely tapered form.

It is still another object of the present invention to provide barrier ribs formed from the above radiation sensitive resin composition and an EL display element comprising the barrier ribs.

Other objects and advantages of the present invention will become apparent from the following description.

According to the present invention, firstly, the above objects and advantages of the present invention are attained by a radiation sensitive resin composition for forming barrier ribs for an EL display element, comprising:

(A) an alkali soluble resin;
(B) a polymerizable compound having an ethylenically unsaturated bond; and
(C) a radiation sensitive polymerization initiator.

Secondly, the above objects and advantages of the present invention are attained by barrier ribs for an EL display element which are formed from the radiation sensitive resin composition of the present invention.

Thirdly, the above objects and advantages of the present invention are attained by an EL display element comprising the barrier ribs of the present invention.

The EL display element of the present invention includes an organic EL display element and inorganic EL display element, out of which an organic EL display element is preferred.

Each component of the radiation sensitive resin composition of the present invention will be described in detail hereinbelow.

Alkali Soluble Resin (A)

Any alkali soluble resin may be used as the alkali soluble resin used in the present invention if it is alkali-soluble.

The alkali soluble resin is preferably a novolak resin, a homopolymer of a radical polymerizable monomer having a phenolic hydroxyl group or carboxyl group, a copolymer of the radical polymerizable monomer and another radical polymerizable monomer, or a copolymer of at least one selected from the group consisting of an unsaturated carboxylic acid and unsaturated carboxylic anhydride, an epoxy group-containing unsaturated compound and another olefinic unsaturated compound other than these unsaturated compounds.

The novolak resin is alkali-soluble and obtained by polycondensing a phenol, preferably a phenol including m-cresol with an aldehyde. Examples of the phenol other than m-cresol used in the production of the novolak resin (to be simply referred to as "phenolic monomer" hereinafter) include phenol, p-cresol, o-cresol, 2,3-xylenol, 2,5-xylenol, 3,5-xylenol, 2,3,5-trimethylphenol, catechol, resorcinol, hydroquinone, methylhydroquinone, pyrogallol and phloroglucinol. These phenolic monomers may be used alone or in combination of two or more, preferably in combination with m-cresol.

The molar ratio of m-cresol/the phenolic monomer is preferably 20/80 to 100/0, more preferably 30/70 to 100/0. When the amount of m-cresol is smaller than 20 mol %, a tendency toward a reduction in the resolution of the composition is seen.

The novolak resin of interest is obtained by polycondensing the above phenol and an aldehyde such as formaldehyde or acetaldehyde in the presence of an acid catalyst such as oxalic acid.

Although water is generally used as a reaction medium for the polycondensation reaction, when the phenol used in the polycondensation reaction does not dissolve in an aqueous solution of an aldehyde and a heterogeneous system is formed from the beginning of the reaction, a hydrophilic organic solvent may be used as the reaction medium. Examples of the solvent used at this point include alcohols such as methanol, ethanol and butanol; and cyclic ethers such as tetrahydrofuran and dioxane. The amount of the reaction medium is preferably 20 to 100 parts by weight based on 100 parts by weight of the total of the reaction raw materials.

The condensation reaction temperature can be suitably controlled according to the reactivity of the reaction raw materials but preferably 10 to 200° C. After the end of the polycondensation reaction, the temperature is elevated to 130 to 230° C. to remove unreacted raw materials, acid catalyst and reaction medium in the system, thereby making it possible to distill off a volatile component under reduced pressure and recover the novolak resin.

The novolak resin used in the present invention has a weight average molecular weight in terms of standard polystyrene (to be referred to as "Mw" hereinafter) of preferably 2,000 to 30,000, particularly preferably 3,500 to 20,000. When Mw is larger than 30,000, the developability of the composition of the present invention may lower and when Mw is smaller than 2,000, film forming properties may deteriorate. In the radiation sensitive resin composition of the present invention, the above novolak resins may be used alone or in combination of two or more.

Preferred examples of the radical polymerizable monomer having a phenolic hydroxyl group or carboxyl group used to synthesize the homopolymer of a radical polymerizable monomer having a phenolic hydroxyl group or carboxyl group and the copolymer of the radical polymerizable monomer and another radical polymerizable monomer include o-hydroxystyrene, m-hydroxystyrene and p-hydroxystyrene, and alkyl-, alkoxy-, halogen-, haloalkyl-, nitro-, cyano-, amide-, ester- and carboxy-substituted products thereof; polyhydroxyvinyl phenols such as vinylhydroquinone, 5-vinylpyrogallol, 6-vinylpyrogallol and 1-vinylphloroglycinol; o-vinylbenzoic acid, m-vinylbenzoic acid and p-vinylbenzoic acid, and alkyl-, alkoxy-, halogen-, nitro-, cyano-, amide- and ester-substituted products thereof; methacrylic acid and acrylic acid, and $\alpha$-position haloalkyl-, alkoxy-, halogen-, nitro- and cyano-substituted products thereof; and unsaturated dicarboxylic acids such as maleic acid, maleic anhydride, fumaric acid, fumaric anhydride, citraconic acid, mesaconic acid, itaconic acid and 1,4-cyclohexanedicarboxylic acid, and methyl, ethyl, propyl, i-propyl, n-butyl, sec-butyl, ter-butyl, phenyl, o-, m- and p-toluyl half esters and half amides thereof.

Out of these, o-hydroxystyrene, m-hydroxystyrene and p-hydroxystyrene, and alkyl- and alkoxy-substituted products thereof are more preferred from the viewpoints of sensitivity at the time of patterning, resolution, film retention after development, heat resistant deformation, solvent resistance, adhesion to a base, and solution keeping stability.

They may be used alone or in combination of two or more.

Examples of the another radical polymerizable monomer include styrene and $\alpha$-position, o-position, m-position and p-position alkyl-, alkoxy-, halogen-, haloalkyl-, nitro-, cyano-, amide- and ester-substituted products of styrene; diolefins such as butadiene, isoprene and chloroprene; and methyl, ethyl, n-propyl, i-propyl, n-butyl, sec-butyl, ter-butyl, pentyl, neopentyl, isoamylhexyl, cyclohexyl, adamantyl, allyl, propargyl, phenyl, naphthyl, anthracenyl, anthraquinonyl, piperonyl, salicyl, cyclohexyl, benzyl, phenethyl, cresyl, glycidyl, 1,1,1-trifluoroethyl, perfluoroethyl, perfluoro-n-propyl, perfluoro-i-propyl, triphenylmethyl, tricyclo[5.2.1.0$^{2,6}$]decan-8-yl (commonly called "dicyclopentanyl" in this technical field), cumyl, 3-(N,N-dimethylamino)propyl, 3-(N,N-dimethylamino)ethyl, furyl and furfuryl esterified products of methacrylic acid and acrylic acid; anilide, amide, N,N-dimethyl, N,N-diethyl, N,N-dipropyl, N,N-diisopropyl, anthranylamide, acrylonitrile, acrolein, methacrylonitrile, vinyl chloride, vinylidene chloride, vinyl fluoride, vinylidene fluoride, N-vinylpyrrolidone, vinylpyridine, vinyl acetate, N-phenylmaleinimide, N-(4-hydroxyphenyl)maleinimide, N-methacryloylphthalimide, and N-acryloylphthalimide of methacrylic acid and acrylic acid. They may be used alone or in combination of two or more.

Out of these, styrene, and $\alpha$-position, o-position, m-position and p-position alkyl-, alkoxy-, halogen- and haloalkyl-substituted products of styrene; butadiene and isoprene; and methyl, ethyl, n-propyl, N-butyl, glycidyl and dicyclopentanyl esterified products of methacrylic acid and acrylic acid are particularly preferred from the viewpoints of sensitivity at the time of patterning, resolution, film retention after development, heat resistant deformation, solvent resistance, adhesion to a base and solution keeping stability.

When a copolymer of a radical polymerizable monomer having a phenolic hydroxyl group and another radical polymerizable monomer is used as the alkali soluble resin, the amount of the another radical polymerizable monomer is preferably 30 wt % or less, particularly preferably 5 to 20 wt % based on the total weight of the radical poymerizable monomer having a phenolic hydroxyl group and another radical polymerizable monomer.

When a copolymer of a radical polymerizable monomer having a carboxyl group and another radical polymerizable monomer is used as the alkali soluble resin, the amount of the another radical polymerizable monomer is preferably 90 wt % or less, particularly preferably 10 to 80 wt % based on the total weight of the radical polymerizable monomer having a carboxyl group and another radical polymerizable monomer.

When the ratio of the another radical polymerizable monomer to the radical polymerizable monomer having a phenolic hydroxyl group or carboxyl group exceeds the above ranges, alkali development may become difficult.

As the polymerization initiator used for the production of the homopolymer of a radical polymerizable monomer having a phenolic hydroxyl group or carboxyl group or the copolymer of the radical polymerizable monomer and another radical polymerizable monomer may be used what are generally known as a radical polymerization initiator, as exemplified by azo compounds such as 2,2'-azobisisobutyronitrile, 2,2'-azobis-(2,4-dimethylvaleronitrile) and 2,2'-azobis-(4-methoxy-2,4-dimethylvaleronitrile); organic peroxides such as benzoyl peroxide, lauroyl peroxide, t-butylperoxypivalate and 1,1'-bis(t-butylperoxy)cyclohexane; and hydrogen peroxides. When a peroxide is used as a radical polymerization initiator, a redox initiator may be used by combining the peroxide with a reducer.

Examples of the solvent used for the production of the homopolymer of a radical polymerizable monomer having a phenolic hydroxyl group or carboxyl group or the copolymer of the radical polymerizable monomer and another radical polymerizable monomer include alcohols such as methanol and ethanol; ethers such as tetrahydrofuran; glycol ethers such as ethylene glycol monomethyl ether and ethylene glycol monoethyl ether; ethylene glycol alkylether acetates such as methyl cellosolve acetate and ethyl cellosolve acetate; diethylene glycols such as diethylene glycol monomethyl ether, diethylene glycol monoethyl ether, diethylene glycol dimethyl ether, diethylene glycol diethyl ether and diethylene glycol ethyl methyl ether; propylene glycol monoalkyl ethers such as propylene glycol monomethyl ether, propylene glycol monoethyl ether, propylene glycol monopropyl ether and propylene glycol monobutyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether acetates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; and esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate and butyl 3-butoxypropionate.

The amount of the solvent is preferably 20 to 1,000 parts by weight based on 100 parts by weight of the total of the reaction raw materials.

The weight average molecular weight in terms of polystyrene of the homopolymer of a radical polymerizable monomer having a phenolic hydroxyl group or carboxyl group or the copolymer of the radical polymerizable monomer and another radical polymerizable monomer is preferably 2,000 to 100,000, more preferably 3,000 to 50,000, particularly preferably 5,000 to 30,000.

When the average molecular weight is smaller than 2,000, pattern shape, resolution, developability and heat resistance are apt to deteriorate and when the average molecular weight is larger than 100,000, developability tends to lower, particularly sensitivity is very liable to lower.

The above homopolymers of a radical polymerizable monomer having a phenolic hydroxyl group or carboxyl group or the above copolymers of the radical polymerizable monomer and another radical polymerizable monomer may be used alone or in combination of two or more.

The alkali soluble resin may be synthesized by introducing a protective group into the carboxyl group or phenolic hydroxyl group before polymerization and removing the protective group after polymerization to provide alkali solubility. Further, the transparency at visible light and softening point of the alkali soluble resin may be changed by hydrogenation or the like.

A description is subsequently given of another copolymer preferably used as the alkali soluble resin (A) in the present invention, namely, the copolymer of at least one compound (may be referred to as "compound (a1)" hereinafter) selected from the group consisting of an unsaturated carboxylic acid and unsaturated carboxylic anhydride, an epoxy group-containing unsaturated compound (may be referred to as "compound (a2)" hereinafter) and another olefinic unsaturated compound (may be referred to as "compound (a3)" hereinafter) other than these unsaturated compounds.

The above copolymer can be produced by radical polymerizing the compound (a1), compound (a2) and compound (a3) in a solvent in the presence of a polymerization initiator.

The copolymer contains a constituent unit derived from the compound (a1) in an amount of preferably 5 to 50 wt %, particularly preferably 10 to 35 wt %. When the copolymer contains this constituent unit in an amount smaller than 5 wt %, it hardly dissolves in an alkali aqueous solution, thereby making it difficult to form barrier ribs. When the copolymer contains the constituent unit in an amount larger than 50 wt %, it may have excessive solubility in an alkali aqueous solution with the result of a great reduction in the thickness of the film of the barrier ribs. Examples of the compound (a1) include monocarboxylic acids such as acrylic acid, methacrylic acid and crotonic acid; dicarboxylic acids such as maleic acid, fumaric acid, citraconic acid, mesaconic acid and itaconic acid; anhydrides of these dicarboxylic acids and mono[(meth)acryloyloxyalkyl]esters of polycarboxylic acids having a functionality of 2 or more such as mono[2-

(meth)acryloyloxyethyl] succinate and mono[2-(meth) acryloyloxyethyl] phthalate; and mono(meth)acrylates of a polymer having a carboxyl group and a hydroxyl group at both terminals such as ω-carboxypolycaprolactone mono (meth)acrylate. Out of these, acrylic acid, methacrylic acid and maleic anhydride are preferred from the viewpoints of copolymerization reactivity, solubility in an alkali aqueous solution and easy acquisition. They may be used alone or in combination.

The above copolymer contains a constituent unit derived from the compound (a2) in an amount of preferably 10 to 70 wt %, particularly preferably 20 to 60 wt %. When the copolymer contains this constituent unit in an amount smaller than 10 wt %, the solvent resistance of the obtained barrier ribs may lower and when the copolymer contains the constituent unit in an amount larger than 70 wt %, its storage stability may deteriorate.

Examples of the compound (a2) include glycidyl (meth) acrylate, glycidyl α-ethylacrylate, glycidyl α-n-propylacrylate, glycidyl α-n-butylacrylate, 3,4-epoxybutyl (meth)acrylate, 6,7-epoxyheptyl (meth)acrylate, 6,7-epoxyheptyl α-ethylacrylate, o-vinylbenzyl glycidyl ether, m-vinylbenzyl glycidyl ether, p-vinylbenzyl glycidyl ether, β-methylglycidyl (meth)acrylate, β-ethylglycidyl (meth) acrylate, β-propylglycidyl (meth)acrylate, β-methylglycidyl α-ethylacrylate, 3-methyl-3,4-epoxybutyl (meth)acrylate, 3-ethyl-3,4-epoxybutyl (meth)acrylate, 4-methyl-4,5-epoxypentyl (meth)acrylate, 5-methyl-5,6-epoxyhexyl (meth)acrylate, β-methylglycidyl (meth)acrylate and 3-methyl-3,4-epoxybutyl (meth)acrylate. Out of these, glycidyl (meth)acrylate, o-vinylbenzyl glycidyl ether, m-vinylbenzyl glycidyl ether, p-vinylbenzyl glycidyl ether and β-methylglycidyl (meth)acrylate are preferred because they can improve the heat resistance and chemical resistance of the barrier rib material. The may be used alone or in combination.

Further, the above copolymer contains a constituent unit derived from the compound (a3) in an amount of preferably 10 to 70 wt %, particularly preferably 20 to 50 wt %. When the copolymer contains this constituent unit in an amount smaller than 10 wt %, its storage stability may lower and when the copolymer contains the constituent unit in an amount larger than 70 wt %, it hardly dissolves in an alkali aqueous solution.

Examples of the compound (a3) include alkyl methacrylates such as methyl methacrylate, ethyl methacrylate, n-butyl methacrylate, sec-butyl methacrylate and t-butyl methacrylate; alkyl acrylates such as methyl acrylate and isopropyl acrylate; cyclic alkyl methacrylates such as cyclohexyl methacrylate, 2-methylcyclohexyl methacrylate, tricyclo[5.2.1.0$^{2,6}$]decan-8-yl methacrylate (generally called dicyclopentanyl methacrylate in this technical field), dicyclopentanyloxyethyl methacrylate and isoboronyl methacrylate; cyclic alkyl acrylates such as cyclohexyl acrylate, 2-methylcyclohexyl acrylate, tricyclo[5.2.1.0$^{2,6}$]decan-8-yl acrylate (generally called dicyclopentanyl acrylate in this technical field), dicyclopentanyloxyethyl acrylate and isoboronyl acrylate; aryl methacrylates such as phenyl methacrylate and benzyl methacrylate; aryl acrylates such as phenyl acrylate and benzyl acrylate; dicarboxylic acid diesters such as diethyl maleate, diethyl fumarate and diethyl itaconate; hydroxyalkyl esters such as 2-hydroxyethyl methacrylate and 2-hydroxypropyl methacrylate; styrene, α-methylstyrene, m-methylstyrene, p-methylstyrene, vinyl toluene, p-methoxystyrene, acrylonitrile, methacrylonitrile, vinyl chloride, vinylidene chloride, acrylamide, methacrylamide, vinyl acetate, 1,3-butadiene, isoprene, 2,3-dimethyl-1,3-butadiene, phenylmaleimide, cyclohexyl maleimide, benzyl maleimide, N-succinimidyl-3-maleimide benzoate, N-succinimidyl-4-maleimide butyrate, N-succinimidyl-6-maleimide caproate, N-succinimidyl-3-maleimide propionate and N-(9-acridinyl)maleimide; bicyclo[2.2.1]hept-2-ene, 5-methylbicyclo[2.2.1]hept-2-ene, 5-ethylbicyclo[2.2.1]hept-2-ene, 5-hydroxybicyclo [2.2.1]hept-2-ene, 5-carboxybicyclo[2.2.1]hept-2-ene, 5-hydroxymethylbicyclo[2.2.1]hept-2-ene, 5-(2'-hydroxyethyl)bicyclo[2.2.1]hept-2-ene, 5-methoxybicyclo [2.2.1]hept-2-ene, 5-ethoxybicyclo[2.2.1]hept-2-ene, 5,6-dihydroxybicyclo[2.2.1]hept-2-ene, 5,6-dicarboxybicyclo [2.2.1]hept-2-ene, 5,6-di(hydroxymethyl) bicyclo[2.2.1] hept-2-ene, 5,6-di(2'-hydroxyethyl) bicyclo[2.2.1]hept-2-ene, 5,6-dimethoxybicyclo[2.2.1]hept-2-ene, 5,6-diethoxybicyclo[2.2.1]hept-2-ene, 5-hydroxy-5-methylbicyclo[2.2.1]hept-2-ene, 5-hydroxy-5-ethylbicyclo [2.2.1]hept-2-ene, 5-carboxy-5-methylbicyclo[2.2.1]hept-2-ene, 5-carboxy-5-ethylbicyclo[2.2.1]hept-2-ene, 5-hydroxymethyl-5-methylbicyclo[2.2.1]hept-2-ene, 5-carboxy-6-methylbicyclo[2.2.1]hept-2-ene, 5-carboxy-6-ethylbicyclo[2.2.1]hept-2-ene, 5,6-dicarboxybicyclo[2.2.1] hept-2-ene anhydride (himic anhydride), 5-t-butoxycarbonylbicyclo[2.2.1]hept-2-ene, 5-cyclohexyloxycarbonylbicyclo[2.2.1]hept-2-ene, 5-phenoxycarbonylbicyclo[2.2.1]hept-2-ene, 5,6-di(t-butoxycarbonyl)bicyclo[2.2.1]hept-2-ene and 5,6-di (cyclohexyloxycarbonyl)bicyclo[2.2.1]hept-2-ene.

Out of these, styrene, t-butyl methacrylate, dicyclopentanyl methacrylate, p-methoxystyrene, 2-methylcyclohexyl acrylate, 1,3-butadiene, phenylmaleimide, cyclohexyl maleimide and bicyclo[2.2.1]hept-2-ene are preferred from the viewpoints of copolymerization reactivity and solubility in an alkali aqueous solution. They may be used alone or in combination.

Examples of the polymerization initiator and solvent used for the production of the above copolymer are the same as those enumerated for the production of the homopolymer of a radical polymerizable monomer having a phenolic hydroxyl group or carboxyl group or the copolymer of the radical polymerizable monomer and another radical polymerizable monomer.

The above copolymer has a weight average molecular weight in terms of polystyrene (to be referred to as "Mw" hereinafter) of $2 \times 10^3$ to $1 \times 10^5$, preferably $3 \times 10^3$ to $3 \times 10^4$ more preferably $5 \times 10^3$ to $2 \times 10^4$. When Mw is smaller than $2 \times 10^3$, the obtained film may be inferior in developability and film retention and deteriorate in pattern shape and heat resistance. When Mw is larger than $1 \times 10^5$, the obtained film may have very low alkali solubility and deteriorate in pattern shape.

In the present invention, part of the above alkali soluble resin may be substituted by a phenolic compound.

The phenolic compound is a phenolic compound having a molecular weight of 1,000 or less. When the molecular weight of the phenolic compound is larger than 1,000, resolution lowers. Examples of the low-molecular weight phenolic compound are compounds having the following structures.

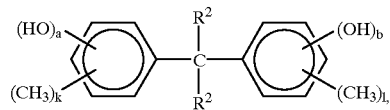

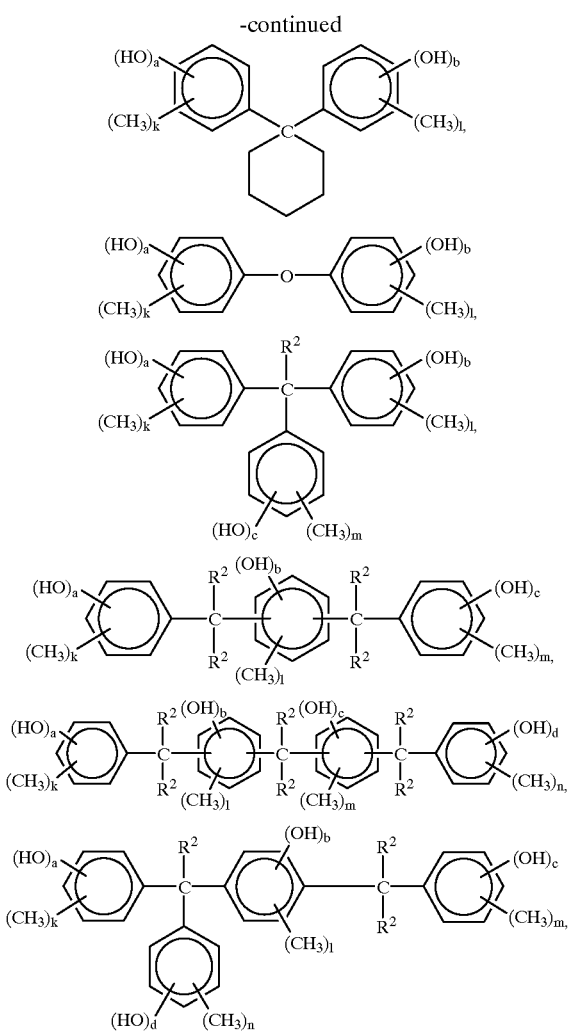

In the above formulas, $R^2$'s may be the same or different and each a hydrogen atom or methyl group, and a, b, c, d, k, l, m and n are each an integer of 0 to 3, with the proviso that $a+b+c+d \geq 2$.

When part of the alkali soluble resin (A) is to be substituted by the phenolic compound, the amount of the phenolic compound is preferably 80 wt % or less, more preferably 50 wt % or less based on the total of the alkali soluble resin (A) and the phenolic compound. When the amount of the phenolic compound is larger tan 80 wt %, a coating film may not be formed.

Polymerizable Compound (B)

The polymerizable compound (B) having an ethylenically unsaturated bond used in the present invention is preferably a (meth)acrylate having a functionality of 1, 2, or 3 or more and no epoxy group because polymerizability is excellent and the strength of the obtained barrier ribs improves.

Examples of the monofunctional (meth)acrylate include 2-hydroxyethyl (meth)acrylate, carbitol (meth)acrylate, isobornyl (meth)acrylate, 3-methoxybutyl (meth)acrylate and 2-(meth)acryloyloxyethyl-2-hydroxypropyl phthalate.

Commercially available products thereof include Aronix M-101, M-111 and M-114 (of Toagosei Chemical Industry Co., Ltd.), KAYARAD TC-110S and TC-120S(of Nippon Kayaku Co., Ltd.) and Biscoat 158 and 2311 (of Osaka Yuki Kagaku Kogyo Co., Ltd.).

Examples of the bifunctional (meth)acrylate include ethylene glycol di(meth)acrylate, 1,6-hexanediol di(meth) acrylate, 1,9-nonanediol di(meth)acrylate, polypropylene glycol di(meth) acrylate, tetraethylene glycol di(meth) acrylate and bisphenoxyethanolfluorene diacrylate. Commercially available products thereof include Aronix M-210, M-240 and M-6200 (of Toagosei Chemical Industry Co., Ltd.), KAYARAD HDDA, HX-220 and R-604 (of Nippon Kayaku Co., Ltd.) and Biscoat 260, 312 and 335HP (of Osaka Yuki Kagaku Kogyo Co., Ltd.).

Examples of the meth(acrylate) having a functionality of 3 or more include trimethylolpropane tri(meth)acrylate, pentaerythritol tri(meth)acrylate, tri((meth)acryloyloxyethyl) phosphate, pentaerythritol tetra(meth)acrylate, dipentaerythritol penta(meth)acrylate and dipentaerythritol hexa(meth) acrylate. Commercially available products thereof include Aronix M-309, M-400, M-402, M-405, M-450, M-7100, M-8030, M-8060, M-1310, M-1600, M-1960, M-8100, M-8530, M-8560 and M-9050 (of Toagosei Chemical Industry Co., Ltd.), KAYARAD TMPTA, DPHA, DPCA-20, DPCA-30, DPCA-60 and DPCA-120 (of Nippon Kayaku Co., Ltd.), and Biscoat 295, 300, 360, GPT, 3PA and 400 (of Osaka Yuki Kagaku Kogyo Co., Ltd.).

Urethane acrylates, urethane adducts and polyester acrylates may also be advantageously used as the polymerizable compound (B) used in the present invention, in addition to the above (meth)acrylate compounds. Commercially available products of these polymerizable compounds include Aronix M-7100, M-8030, M-8060, M-1310, M-1600, M-1960, M-8100, M-8530, M-8560 and M-9050 (of Toagosei Chemical Industry Co., Ltd.).

Out of these, bisphenoxyethanolfluorene diacrylate, tri ((meth)acryloyloxyethyl)phosphate and dipentaerythritol hexa(meth)acrylate are preferred from the viewpoint of reactivity.

The amount of the polymerizable compound (B) in the present invention is preferably 40 to 200 parts by weight, more preferably 60 to 150 parts by weight based on 100 parts by weight of the alkali soluble resin (A).

When the amount of the polymerizable compound (B) is smaller than 40 parts by weight, a reduction in the thickness of the film of the obtained barrier ribs readily may occur. When the amount is larger than 200 parts by weight, the adhesion of the barrier ribs to a base substrate may lower.

These (meth)acrylates having a functionality of 1, 2, or 3 or more, urethane acrylates, urethane adducts and polyester acrylates may be used alone or in combination.

Radiation Sensitive Polymerization Initiator (C)

The radiation sensitive polymerization initiator (C) in the present invention means a compound which causes decomposition or the cleavage of a bond upon exposure and forms an active species capable of starting the radical, anionic or cationic polymerization of the above polymerizable compound (B).

The polymerization initiator is preferably a biimidazole-based compound, benzophenone-based optical radical generating agent or triazine-based compound.

Examples of the above biimidazole-based compound include 2,2'-bis(2-chlorophenyl)-4,4',5,5'-tetrakis(4-ethoxycarbonylphenyl)-1,2'-biimidazole, 2,2'-bis(2-bromophenyl)-4,4',5,5'-tetrakis(4-ethoxycarbonylphenyl)-1, 2'-biimidazole, 2,2'-bis(2-chlorophenyl)-4,4',5,5'-tetraphenyl-1,2'-biimidazole, 2,2'-bis(2,4-dichlorophenyl)-4,4',5,5'-tetraphenyl-1,2'-biimidazole, 2,2'-bis(2,4,6-trichlorophenyl)-4,4',5,5'-tetraphenyl-1,2'-biimidazole, 2,2'-bis(2-bromophenyl)-4,4',5,5'-tetraphenyl-1,2'-biimidazole, 2,2'-bis(2,4-dibromophenyl)-4,4',5,5'-tetraphenyl-1,2'-biimidazole and 2,2'-bis(2,4,6-tribromophenyl)-4,4',5,5'-tetraphenyl-1,2'-biimidazole.

Out of these biimidazole-based compounds, 2,2'-bis(2-chlorophenyl)-4,4',5,5'-tetraphenyl-1,2'-biimidazole, 2,2'-bis(2,4-dichlorophenyl)-4,4',5,5'-tetraphenyl-1,2'-biimidazole and 2,2'-bis(2,4,6-trichlorophenyl)-4,4',5,5'-tetraphenyl-1,2'-biimidazole are preferred and 2,2'-bis(2,4-dichlorophenyl)-4,4',5,5'-tetraphenyl-1,2'-biimidazole is particularly preferred.

These biimidazole-based compounds have excellent solubility in a solvent, do not form foreign matter such as an undissolved product and precipitate, fully promotes a curing reaction upon exposure with a small amount of energy due to high sensitivity, have high contrast and does not cause a curing reaction in an unexposed portion. Therefore, the coating film after exposure is clearly divided into a cured portion insoluble in a developer and an uncured portion having high solubility in a developer, whereby a high-definition pixel array can be formed based on the predetermined layout of a pixel pattern without an undercut portion.

The benzophenone-based optical radical generating agent is a compound having a benzoyl structure or another benzophenone-based optical radical generating agent. Examples of the benzophenone-based optical radical generating agent include 2-hydroxy-2-methyl-1-phenylpropan-1-one, 1-(4-i-propylphenyl)-2-hydroxy-2-methylpropan-1-one, 4-(2-hydroxyethoxy)phenyl-(2-hydroxy-2-propyl) ketone, 1-hydroxycyclohexylphenyl ketone, 2,2-dimethoxy-2-phenylacetophenone, 2-methyl-(4-methylthiophenyl)-2-morpholino-1-propan-1-one, 2-benzyl-2-dimethylamino-1-(4-morpholinophenyl)butan-1-one, benzophenone, 3,3'-dimethyl-4-methoxybenzophenone, 2,4-diethylthioxanthone, 4-azidobenzaldehyde, 4-azidoacetophenone, 4-azidobenzalacetophenone, azidopyrene, 4-diazodiphenylamine, 4-diazo-4'-methoxydiphenylamine, 4-diazo-3-methoxydiphenylamine, bis(2,6-dimethoxybenzoyl)-2,4,4-trimethylpentylphosphine oxide, dibenzoyl, benzoin isobutyl ether, N-phenylthioacridone and triphenylpyrylium perchlorate.

Out of these benzophenone-based optical radical generating agents, 2-hydroxy-2-methyl-1-phenylpropan-1-one, 2-methyl-(4-methylthiophenyl)-2-morpholino-1-propan-1-one and 2-benzyl-2-dimethylamino-1-(4-morpholinophenyl)butan-1-one are preferred because the formed barrier rib pattern hardly comes off from the substrate during development and pattern strength and sensitivity are high.

Further, examples of the triazine-based compound include tris(2,4,6-trichloromethyl)-s-triazine, 2-phenyl-bis(4,6-trichloromethyl)-s-triazine, 2-(4-chlorophenyl)-bis(4,6-trichloromethyl)-s-triazine, 2-(3-chlorophenyl)-bis(4,6-trichloromethyl)-s-triazine, 2-(2-chlorophenyl)-bis(4,6-trichloromethyl)-s-triazine, 2-(4-methoxyphenyl)-bis(4,6-trichloromethyl)-s-triazine, 2-(3-methoxyphenyl)-bis(4,6-trichloromethyl)-s-triazine, 2-(2-methoxyphenyl)-bis(4,6-trichloromethyl)-s-triazine, 2-(4-methylthiophenyl)-bis(4,6-trichloromethyl)-s-triazine, 2-(3-methylthiophenyl)-bis(4,6-trichloromethyl)-s-triazine, 2-(2-methylthiophenyl)-bis(4,6-trichloromethyl)-s-triazine, 2-(4-methoxynaphthyl)-bis(4,6-trichloromethyl)-s-triazine, 2-(3-methoxynaphthyl)-bis(4,6-trichloromethyl)-s-triazine, 2-(2-methoxynaphthyl)-bis(4,6-trichloromethyl)-s-triazine, 2-(4-methoxy-β-styryl)-bis(4,6-trichloromethyl)-s-triazine, 2-(3-methoxy-β-styryl)-bis(4,6-trichloromethyl)-s-triazine, 2-(2-methoxy-β-styryl)-bis(4,6-trichloromethyl)-s-triazine, 2-(3,4,5-trimethoxy-β-styryl)-bis(4,6-trichloromethyl)-s-triazine, 2-(4-methylthio-β-styryl)-bis(4,6-trichloromethyl)-s-triazine, 2-(3-methylthio-β-styryl)-bis(4,6-trichloromethyl)-s-triazine, 2-piperonyl-bis(4,6-trichloromethyl)-s-triazine, 2-[2-(furan-2-yl)ethenyl]-bis(4,6-trichloromethyl)-s-triazine, 2-[2-(5-methylfuran-2-yl)ethenyl]-bis(4,6-trichloromethyl)-s-triazine and 2-[2-(4-diethylamino-2-methylphenyl)ethenyl]-bis(4,6-trichloromethyl)-s-triazine.

Out of these triazine compounds, 2-(4-methoxyphenyl)-bis(4,6-trichloromethyl)-s-triazine, 2-(4-methoxy-β-styryl)-bis(4,6-trichloromethyl)-s-triazine and 2-[2-(furan-2-yl)ethenyl]-bis(4,6-trichloromethyl)-s-triazine are preferred from the viewpoint of high sensitivity to radiation.

Commercially available products of the above radiation sensitive radical polymerization initiators include IRGACURE-184, 369, 500, 651, 907, 1700, 819, 124, 1000, 2959, 149, 1800 and 1850 and Darocur-1173, 1116, 2959, 1664 and 4043 (of Chiba Specialty Chemicals Co., Ltd.), KAYACURE-DETX, MBP, DMBI, EPA and OA (of Nippon Kayaku Co., Ltd.), VICURE-10 and 55 (of STAUFFER Co., Ltd.), TRIGONALP1 (of AKZO Co., Ltd.), SANDORAY 1000 (of SANDOZ Co., Ltd.), DEAP (of APJOHN Co., Ltd.) and QUANTACURE-PDO, ITX and EPD (of WARD BLEKINSOP Co., Ltd.).

The above radiation sensitive polymerization initiators may be used alone or in combination of two or more.

The amount of the radiation sensitive polymerization initiator (C) in the present invention is preferably 0.01 to 500 parts by weight, more preferably 1 to 300 parts by weight, particularly preferably 10 to 200 parts by weight based on 100 parts by weight of the polymerizable compound (B). When the amount of the radiation sensitive polymerization initiator is smaller than 0.01 part by weight, curing by exposure becomes insufficient with the result that the pattern may be wholly or partly broken or undercut and when the amount is larger than 500 parts by weight, the formed pattern readily falls off from the substrate during development and stains, film residues or the like are readily produced in an area other than a portion where the pattern is formed.

In the present invention, at least one selected from the group consisting of a sensitizer, curing aid, ultraviolet light absorber and optical crosslinking agent composed of a polymer compound or optical sensitizer (to be referred to as "polymer optical crosslinking and sensitizing agent" hereinafter) may be optionally used in conjunction with the above radiation sensitive polymerization initiator.

Examples of the sensitizer include 4,4'-bis(dimethylamino)benzophenone, 4,4'-bis(diethylamino)benzophenone, 4-dimethylaminobenzophenone, 4-diethylaminobenzophenone, 4-diethylaminoacetophenone, 4-dimethylaminopropiophenone, ethyl-4-dimethylaminobenzoate, 2-ethylhexyl-1,4-dimethylaminobenzoate, 2,5-bis(4-diethylaminobenzal)cyclohexanone, 7-diethylamino-3-(4-diethylaminobenzoyl)coumarine, 4-(diethylamino)chalcone and diethylthioxanthone.

Examples of the curing aid include chain transfer agents such as 2-mercaptobenzoimidazole, 2-mercaptobenzothiazole, 2-mercaptobenzooxazole, 2,5-dimercapto-1,3,4-thiadiazole, 2-mercapto-4,6-dimethylaminopyridine, 1-phenyl-5-mercapto-lH-tetrazole and 3-mercapto-4-methyl-4H-1,2,4-triazole.

The ultraviolet light absorber is a benzotriazole, salicylate, benzophenone, substituted acrylonitrile, xanthene, coumarin, flavone or chalcone. Specific examples of the ultraviolet light absorber include Tinubin 234 (2-(2-hydroxy-3,5-bis(α, α-dimethylbenzyl)phenyl)-2H-benzotriazole), Tinubins 571 (hydroxyphenylbenzotriazole derivative) and Tinubin 1130 (condensate of methyl-3-(3-t-butyl-5-(2H-benzotriazol-2-yl)-4-hydroxyphenyl)

propionate and polyethylene glycol (molecular weight of 300)) of Chiba Specialty Chemicals Co., Ltd., 1,7-bis(4-hydroxy-3-methoxyphenyl)-1,6-heptadiene-3,5-dione and dibenzylideneacetone. The amount of the ultraviolet light absorber is preferably 20 parts or less by weight, more preferably 10 parts or less by weight based on 100 parts by weight of the copolymer (A).

Further, the above polymer optical crosslinking and sensitizing agent is a polymer compound having in the main chain and/or side chain a functional group which can serve as an optical crosslinking agent and/or optical sensitizer. Examples of the polymer crosslinking and sensitizing agent include a condensate of 4-azidobenzaldehyde and polyvinyl alcohol, condensate of 4-azidobenzaldehyde and phenol novolak resin, homopolymer or copolymer of 4-acryloylphenylcinnamoyl ester, 1,4-polybutadiene and 1,2-polybutadiene.

Out of the above sensitizers, curing aids and polymer optical crosslinking and sensitizing agents, 4,4'-bis(dimethylamino)benzophenone, 4-diethylaminobenzophenone and 2-mercaptobenzothiazole are preferred because the formed pattern rarely falls off from the substrate during development and the strength and sensitivity of the pattern are high.

In the present invention, a combination of at least one selected from the group consisting of biimidazole-based compounds and at least one selected from the group consisting of benzophenone-based optical radical generating agents, benzophenone-based sensitizers and thiazole-based curing aids; and one selected from the group consisting of compounds having a benzoyl structure or a combination of it and a benzophenone-based sensitizer are particularly preferred as the radiation sensitive polymerization initiator.

Examples of the above particularly preferred combinations include a combination of 2,2'-bis(2-chlorophenyl)-4,4',5,5'-tetrakis(4-ethoxycarbonylphenyl)-1,2'-biimidazole and 4,4'-bis(diethylamino)benzophenone, a combination of 2,2'-bis(2-chlorophenyl)-4,4',5,5'-tetrakis(4-ethoxycarbonylphenyl)-1,2'-biimidazole, 4,4'-bis(diethylamino)benzophenone and 2-benzyl-2-dimethylamino-1-(4-morpholinophenyl)butan-1-one, a combination of 2,2'-bis(2-chlorophenyl)-4-4',5,5'-tetrakis(4-ethoxycarbonylphenyl)-1,2'-biimidazole, 4,4'-bis(diethylamino)benzophenone and 1-hydroxycyclohexylphenyl ketone, a combination of 2,2'-bis(2-chlorophenyl)-4,4'-5,5'-tetrakis(4-ethoxycarbonylphenyl)-1,2'-biimidazole, 4,4'-bis(dimethylamino)benzophenone, 1-hydroxycyclohexylphenyl ketone and 2-mercaptobenzothiazole, a combination of 2,2'-bis(2,4-dichlorophenyl)-4,4',5,5'-tetraphenyl-1,2'-biimidazole and 4,4'-bis(diethylamino)benzophenone, a combination of 2,2'-bis(2,4-dibromophenyl)-4,4',5,5'-tetraphenyl-1,2'-biimidazole, 4,4'-bis(diethylamino)benzophenone and 2-benzyl-2-dimethylamino-1-(4-morpholinophenyl)butan-1-one, a combination of 2,2'-bis(2,4-dibromophenyl)-4,4',5,5'-tetraphenyl-1,2'-biimidazole, 4,4'-bis(diethylamino)benzophenone and 1-hydroxycyclohexylphenyl ketone, a combination of 2,2'-bis(2,4,6-trichlorophenyl)-4,4',5,5'-tetraphenyl-1,2'-biimidazole, 4,4'-bis(dimethylamino)benzophenone, 1-hydroxycyclohexylphenyl ketone and 2-mercaptobenzothiazole, a combination of 2-hydroxy-2-methyl-1-phenylpropan-1-one, 4-diethylaminobenzophenone, 2-methyl-(4-methylthiophenyl)-2-morpholino-1-propan-1-one and 4-diethylaminobenzophenone, a combination of 2-benzyl-2-dimethylamino-1-(4-morpholinophenyl)-butan-1-one and 4-diethylaminobenzophenone, a combination of 2-hydroxy-2-methyl-1-phenylpropan-1-one, 4-diethylaminobenzophenone and diethylthioxanthone, a combination of 2-methyl-(4-methylthiophenyl)-2-morpholino-1-propan-1-one, 4-diethylaminobenzophenone and diethylthioxanthone, and a combination of 2-benzyl-2-dimethylamino-1-(4-morpholinophenyl)-butan-1-one, 4-diethylaminobenzophenone and diethylthioxanthone.

In the present invention, the total amount of the benzophenone-based optical radical generating agent and the compound having a trihalomethyl group is preferably 80 wt % or less based on the whole radiation sensitive polymerization initiator. The total amount of the sensitizer and curing aid is preferably 80 wt % or less based on the whole radiation sensitive polymerization initiator and the amount of the polymer optical crosslinking and sensitizing agent is preferably 200 parts or less by weight, more preferably 180 parts or less by weight based on 100 parts by weight of the biimidazole-based compound.

Colorant (D)

A colorant including a black pigment may be used in the present invention.

The black pigment may be either inorganic or organic, and a single pigment or a mixture of two or more pigments may be used. As the black pigment in the present invention is preferably a pigment having high heat resistance and high color development properties, more preferably a pigment having high thermal decomposition resistance, particularly preferably a combination of carbon black and/or two or more organic pigments.

Examples of the carbon black used in the present invention include furnace black such as SAF, SAF-HS, ISAF, ISAF-LS, ISAF-HS, HAF, HAF-LS, HAF-HS, NAF, FEF, FEF-HS, SRF, SRF-LM, SRF-LS, GPF, ECF, N-339 and N-351; thermal black such as FT and MT; and acetylene black.

These carbon blacks may be used alone or in admixture of two or more.

Black inorganic pigments other than carbon black used in the present invention include titanium black, Cu—Fe—Mn-based oxide and metal oxides such as synthetic iron black.

These inorganic pigments may be used alone or in admixture of two or more.

Further, examples of the organic pigment used in the present invention include compounds classified as pigments according to Color Index (C.I.; The Society of Dyers and Colourists), specifically compounds having the following color index (C.I.) numbers:

C.I. Pigment Yellow 12, C.I. Pigment Yellow 13, C.I. Pigment Yellow 14, C.I. Pigment Yellow 17, C.I. Pigment Yellow 20, C.I. Pigment Yellow 24, C.I. Pigment Yellow 31, C.I. Pigment Yellow 55, C.I. Pigment Yellow 83, C.I. Pigment Yellow 93, C.I. Pigment Yellow 109, C.I. Pigment Yellow 110, C.I. Pigment Yellow 138, C.I. Pigment Yellow 139, C.I. Pigment Yellow 150, C.I. Pigment Yellow 153, C.I. Pigment Yellow 154, C.I. Pigment Yellow 155, C.I. Pigment Yellow 166 and C.I. Pigment Yellow 168;

C.I. Pigment Orange 36, C.I. Pigment Orange 43, C.I. Pigment Orange 51, C.I. Pigment Orange 61 and C.I. Pigment Orange 71;

C.I. Pigment Red 9, C.I. Pigment Red 97, C.I. Pigment Red 122, C.I. Pigment Red 123, C.I. Pigment Red 149, C.I. Pigment Red 168, C.I. Pigment Red 176, C.I. Pigment Red 177, C.I. Pigment Red 180, C.I. Pigment Red 209, C.I. Pigment Red 215, C.I. Pigment Red 224, C.I. Pigment Red 242 and C.I. Pigment Red 254;

C.I. Pigment Violet 19, C.I. Pigment Violet 23 and C.I. Pigment Violet 29;

C.I. Pigment Blue 15, C.I. Pigment Blue 60, C.I. Pigment Blue 15:3, C.I. Pigment Blue 15:4 and C.I. Pigment Blue 15:6;

C.I. Pigment Green 7 and C.I. Pigment Green 36;
C.I. Pigment Brown 23 and C.I. Pigment Brown 25; and
C.I. Pigment Black 1 and C.I. Pigment Black 7.

These organic pigments are suitably selected as a light screening barrier rib material to obtain a desired color.

In the present invention, the particularly preferred organic pigment is a mixture of C.I. Pigment Red 177 and C. I. Pigment Blue 15:4 and/or C.I. Pigment Blue 15:6.

An extender pigment may be added to the colorant in the present invention. Examples of the extender pigment include barium sulfate, barium carbonate, calcium carbonate, silica, basic magnesium carbonate, alumina white, Cloth White, Saturn White and hydrotalcite.

These extender pigments may be used alone or in admixture of two or more.

The amount of the extender pigment is generally 0 to 100 parts by weight, preferably 5 to 50 parts by weight, more preferably 10 to 40 parts by weight based on 100 parts by weight of the black pigment.

In the present invention, the surfaces of the black pigment and the extender pigment may be modified by a polymer before use.

The colorant in the present invention may be used in conjunction with a dispersant as the case may be. The dispersant is a cationic, anionic, nonionic, amphoteric, silicone-based or fluorine-based surfactant.

Specific examples of the surfactant include polyoxyethylene alkyl ethers such as polyoxyethylene lauryl ether, polyoxyethylene stearyl ether and polyoxyethylene oleyl ether; polyoxyethylene alkylphenyl ethers such as polyoxyethylene octylphenyl ether and polyoxyethylene nonylphenyl ether; polyethylene glycol diesters such as polyethylene glycol dilaurate and polyethylene glycol distearate; sorbitan fatty acid esters; fatty acid modified polyesters; tertiary amine modified polyurethanes; and polyethylene imines, as exemplified by commercially available products such as KP (of Shin-Etsu Chemical Co., Ltd.), Polyflow (of Kyoeisha Kagaku Co., Ltd.), F Top (of Tokem Products Co., Ltd.), Megafac (of Dainippon Ink and Chemicals, Inc.), Florade (of Sumitomo 3M Limited), Asahi Guard and Surflon (of Asahi Glass Co., Ltd.), EFKA-46 and 47 (of FK Chemicals BV (EFKA) Co., Ltd.), Disperbyk (of BYK Co., Ltd.) and Disparon (of Kusumoto Kasei Co., Ltd.).

These surfactants may be used alone or in admixture of two or more.

The amount of the surfactant is generally 0.5 to 50 parts by weight, preferably 1 to 30 parts by weight based on 100 parts by weight of the colorant.

Other Additives

The radiation sensitive resin composition of the present invention may contain other components as required in limits not prejudicial to the object of the present invention. The other components include crosslinking agent, surfactant and adhesion aid.

The crosslinking agent is a crosslinking agent having two or more reactive groups in one molecule to improve performance as a permanent film. Examples of the crosslinking agent include an alkoxymethylated melamine resin, alkoxymethylated benzoguanamine resin, alkoxymethylated glycol uryl resin and alkoxymethylated urea resin. They are obtained by converting the methylol group of a methylolmelamine resin, methylolbenzoguanamine resin, methylolglycoluril resin and methylolurea resin into an alkoxymethyl group. The type of the alkoxymethyl group is not particularly limited but may be a methoxymethyl group, ethoxymethyl group, propoxymethyl group or butoxymethyl group.

Out of these crosslinking agents, an alkoxymethylated melamine resin and alkoxymethylated benzoguanamine resin are preferred.

Preferred commercially available products of the crosslinking agent include Simel 300, 301, 303, 370, 325, 327, 701, 266, 267, 238, 1141, 272, 202, 1156, 1158, 1123, 1170, 1174, UFR65 and 300 (of Mitsui Sianamid Co., Ltd.), and Nicarak Mx-750, Mx-032, Mx-706, Mx-708, Mx-40, Mx-31, Ms-11 and Mw-30 (of Sanwa Chemical Co., Ltd.).

These crosslinking agents may be used alone or in combination of two or more.

The crosslinking agent is used in an amount of preferably 50 parts or less by weight, more preferably 5 to 50 parts by weight, particularly preferably 10 to 30 parts by weight based on 100 parts by weight of the alkali soluble resin (A).

The above surfactant is added to improve coatability.

A fluorine-based surfactant or silicone-based surfactant may be preferably used as the surfactant.

The fluorine-based surf actant is preferably a compound having a fluoroalkyl or fluoroalkylene group at at least one of a terminal, main chain and side chain. Examples of the fluorine-based surfactant include 1,1,2,2-tetrafluorooctyl(1, 1,2,2-tetrafluoropropyl)ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, hexapropylene glycol di(1,1,2,2,3,3-hexafluoropentyl)ether, sodium perfluorododecyl sulfonate, 1,1,2,2,8,8,9,9,10,10-decafluorododecane, 1,1,2,2,3,3-hexafluorodecane, sodium fluoroalkylbenzenesulfonate, sodium fluoroalkylphosphonate, sodium fluoroalkylcarboxylate, fluoroalkyl polyoxyethylene ether, diglycerine tetrakis (fluoroalkylpolyoxyethylene ether), fluoroalkylammonium iodide, fluoroalkyl betain, fluoroalkylpolyoxyethylene ether, perfluoroalkylpolyoxyethanol, perfluoroalkyl alkoxylate and fluorine-based alkyl esters.

Commercially available products thereof include BM-1000 and BM-1100 (of BM CHEMIE Co., Ltd.), Megafac F142D, F172, F173, F183, F178, F191 and F471 (of Dainippon Ink and Chemicals, Ltd.), Florade FC-170C, FC-171, FC-430 and FC-431 (of Sumitomo 3M Limited), Surflon S-112, S-113, S-131, S-141, S-145, S-382, SC-101, SC-102, SC-103, SC-104, SC-105 and SC-106 (of Asahi Glass Co., Ltd.), F Top EF301, 303 and 352 (of Shin Akita Kasei Co., Ltd.), and Futagent FT-100, FT-110, FT-140A, FT-150, FT-250, FT-251, FTX-251, FTX-218, FT-300, FT-310 and FT-400S (of Neos Co., Ltd.).

Commercially available products of the silicone-based surfactant include Toray Silicone DC3PA, DC7PA, SH11PA, SH21PA, SH28PA, SH29PA, SH30PA, SH-190, SH-193, SZ-6032, SF-8428, DC-57 and DC-190 (of Toray Dowcorning Silicone Co., Ltd.), and TSF-4440, TSF-4300, TSF-4445, TSF-4446, TSF-4460 and TSF-4452 (of Toshiba Silicone Co., Ltd.).

Polyoxyethylene alkyl ethers such as polyoxyethylene lauryl ether, polyoxyethylene stearyl ether and polyoxyethylene oleyl ether; polyoxyethylene aryl ethers such as polyoxyethylene octylphenyl ether and polyoxyethylene nonylphenyl ether; nonionic surfactants such as polyoxyethylene dialkyl ethers exemplified by polyoxyethylene dilaurate and polyoxyethylene distearate; organosiloxane polymer KP341 (of Shin-Etsu Chemical Co., Ltd.) and (meth)acrylic acid-based copolymer Polyflow Nos. 57 and 95 (of Kyoeisha Kagaku Co., Ltd.) may also be used.

The surfactant is used in an amount of preferably 5 parts or less by weight, more preferably 2 parts or less by weight based on 100 parts by weight of the copolymer (A). When the amount of the surfactant is larger than 5 parts by weight, the surface of the film may be roughened at the time of application.

The adhesion aid is used to improve adhesion to the substrate.

The adhesion aid is preferably a functional silane coupling agent, as exemplified by silane coupling agents having a reactive substituent such as carboxyl group, methacryloyl group, isocyanate group or epoxy group. Specific examples of the adhesion aid include trimethoxysilylbenzoic acid, γ-methacryloxylproyl trimethoxysilane, vinyltriacetoxysilane, vinyltrimethoxysilane, γ-isocyanatepropyl triethoxysilane, γ-glycidoxypropyl trimethoxysilane and β-(3,4-epoxycyclohexyl)ethyl trimethoxysilane.

The adhesion aid is used in an amount of preferably 20 parts or less by weight, more preferably 10 parts or less by weight based on 100 parts by weight of the copolymer (A). When the amount of the adhesion aid is larger than 20 parts by weight, the residue after development is easily produced.

Preparation of Radiation Sensitive Resin Composition

The radiation sensitive resin composition of the present invention is prepared by uniformly mixing together the above alkali soluble resin (A), polymerizable compound (B) and radiation sensitive polymerization initiator (C) and optionally other additives. The radiation sensitive resin composition of the present invention is advantageously used as a solution of the above components dissolved in an appropriate solvent or as a dispersion of the above components including an insoluble component such as a pigment uniformly dispersed therein if any. For example, the copolymer (A), polymerizable compound (B) and polymerization initiator (C) and other compounding additives to be added optionally are mixed together in a predetermined ratio to prepare the radiation sensitive resin composition in a solution or dispersion state.

The solvent used for the preparation of the radiation sensitive resin composition of the present invention is a solvent which uniformly dissolves the copolymer (A), polymerizable compound (B) and polymerization initiator (C) and other additives to be added optionally and does not react with these components.

Examples of the solvent include alcohols such as methanol and ethanol; ethers such as tetrahydrofuran; glycol ethers such as ethylene glycol monomethyl ether and ethylene glycol monoethyl ether; ethylene glycol alkylether acetates such as methyl cellosolve acetate and ethyl cellosolve acetate; diethylene glycols such as diethylene glycol monomethyl ether, diethylene glycol monoethyl ether and diethylene glycol dimethyl ether; propylene glycol monoalkyl ethers such as propylene glycol methyl ether, propylene glycol ethyl ether, propylene glycol propyl ether and propylene glycol butyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether acetates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; and esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, methyl 3-butoxypropionate, ethyl 3-butoxypropionate, propyl 3-butoxypropionate and butyl 3-butoxypropionate.

Out of these, glycol ethers, ethylene glycol alkyl ether acetates, propylene glycol alkyl ether acetates, esters and diethylene glycols are preferred from the viewpoints of solubility, reactivity with each component and the formation ease of a coating film.

A high boiling point solvent may be used in combination with the above solvent. Examples of the high boiling point solvent include N-methylformamide, N,N-dimethylformamide, N-methylformanilide, N-methylacetamide, N,N-dimethylacetamide, N-methylpyrrolidone, dimethyl sulfoxide, benzylethyl ether, dihexyl ether, acetonile acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenyl cellosolve acetate.

The radiation sensitive resin composition of the present invention is prepared by using the above solvent and its solid content is suitably controlled according to its use purpose.

The solid content can be, for example, 3 to 60 wt %, preferably 10 to 50 wt %.

The above prepared composition solution may be filtered with a Millipore filter having a pore diameter of about 0.5 μm before use.

Barrier Rib Forming Method

The method of forming the barrier ribs of the present invention from the radiation sensitive resin composition of the present invention will be described in detail hereinbelow.

A coating film was formed by applying a solution of the radiation sensitive resin composition of the present invention to the surface of a substrate and heating it to remove the solvent. The application of the solution of the radiation sensitive resin composition to the surface of the substrate is carried out by such means as spray coating, roll coating, rotational coating or bar coating.

The coating film is then pre-baked. The solvent is volatilized by pre-baking to obtain a coating film having no fluidity.

The heating conditions differ according to the types and blending ratio of the components but preferably the coating film is heated at 60 to 120° C. for 10 to 600 seconds.

Thereafter, the heated coating film is exposed to radiation through a predetermined pattern mask and developed with a developer to remove unrequired portions.

The developer is an aqueous solution of an alkali exemplified by inorganic alkalis such as sodium hydroxide, potassium hydroxide, sodium carbonate, sodium silicate, sodium metasilicate and ammonia water; primary amines such as ethylamine and n-propylamine; secondary amines such as diethylamine and di-n-propylamine; tertiary amines such as triethylamine, methyldiethylamine and N-methylpyrrolidone; alcohol amines such as dimethylethanolamine and triethanolamine; quaternary ammonium salts such as tetramethylammonium hydroxide, tetraethylammonium hydroxide and choline; and cyclic amines such as pyrrole, piperidine, 1,8-diazabicyclo[5.4.0]-7-undecene and 1,5-diazabicyclo[4.3.0]-5-nonane.

An aqueous solution prepared by adding a water-soluble organic solvent such as methanol or ethanol, or surfactant in an appropriate amount to the above alkali aqueous solution may be used as the developer.

The development time is, for example, 30 to 180 seconds. Development may be either puddle or dip development. After development, the coating film is washed with running water for 30 to 90 seconds and dried with compressed air or compressed nitrogen to remove water on the substrate, thereby forming a barrier rib pattern. Thereafter, the pattern is heated on a hot plate or in an oven at a predetermined temperature, for example, 150 to 250° C. for a predetermined time, for example, 5 to 30 minutes on the hot plate or 30 to 90 minutes in the oven to obtain the barrier ribs of the present invention.

Each of the barrier ribs of the present invention preferably has a trapezoidal sectional form (inversely tapered form) with the longer top side than the bottom side in an irradiation direction, more preferably a sectional form with an angle formed by a straight line connecting the upper pattern edge and the lower pattern edge and the top side of 15 to 75° C. As the sectional form is an inversely tapered form, the deposition of an organic EL medium from above and not in an oblique direction is made possible. That is, the organic EL medium is deposited from above, whereby the organic EL medium is uniformly adhered to an opening between barrier ribs, thereby making it possible to secure the sufficient brightness of a display element. When a cathode material is deposited from above, it is possible to prevent the cathode material from entering the inversely tapered lower portion, thereby making it possible to secure insulation between cathodes.

The amount of a volatile component generated by heating the barrier rib of the present invention at 25 to 200° C. is preferably 10 wt % or less, more preferably 5 wt % or less, particularly preferably 2 wt % or less, the most preferably 1 wt % or less.

By controlling the amount of the volatile component, the entry of impurities into the EL layer can be prevented, thereby making it possible to prevent such problems as the occurrence of a lighting failure of the EL display element and a reduction in the brightness of emitted light.

The amount of the volatile component can be evaluated by TDS (Thermal Desorption Spectroscopy).

Further, when the barrier rib of the present invention contains a colorant, it has light screening properties and preferably an OD value of 0.1 or more when it has a film thickness of 1 μm. When the OD value is smaller than 0.1, the light emitted from EL easily transmits the barrier rib and it is difficult to prevent a reduction in light emission contrast.

Production of Organic EL Display Element

The organic EL display element of the present invention comprises the barrier ribs formed as described above.

The organic EL display element of the present invention is produced as follows, for example.

Transparent electrodes made from ITO or the like are formed on a glass substrate by sputtering, and a positive photoresist is applied to the glass substrate and pre-baked. The resist is exposed through a mask and developed to form a pattern, the ITO film is etched with a hydrochloric acid-based etchant such as ferric chloride, and the resist film is peeled off to form a transparent electrode pattern such as a striped pattern. The radiation sensitive resin composition of the present invention is applied to this substrate having a transparent electrode pattern to form inversely tapered barrier ribs as described above. Thereafter, a hole transport layer, organic EL medium layer and cathode layer are formed by a deposition method sequentially. The hole transport layer is formed from a phthalocyanine-based material such as CuPc or $H_2Pc$, or aromatic amine. The organic EL medium is a material obtained by doping an $Alq_3$ or $BeBq_3$ substrate with quinacridone or coumarine. The cathode material is Mg—Al, Al—Li, Al—$Li_2O$ or Al—Lif.

The organic EL display element is produced by sealing an SUS can having a hollow structure and the above substrate with a sealing material such as an epoxy resin and assembling them into a module.

EXAMPLES

The following synthesis examples and examples are provided for the purpose of further illustrating the present invention but are in no way to be taken as limiting.

Synthesis Example 1

Synthesis of Resin A-1

176 g (0.1 mol) of t-butoxystyrene and 5.8 g (0.04 mol) of azobisbutyronitrile were charged into a flask equipped with a cooling tube, stirrer and thermometer, and 250 ml of propylene glycol monomethyl ether was added to the flask and dissolved to carry out polymerization at 75° C. for 4 hours. The obtained poly-t-butoxystyrene solution was mixed with 50 g of a 5 wt % aqueous solution of sulfuric acid to carry out a hydrolytic reaction at 100° C. for 3 hours. The reaction product was washed with 1,000 ml of deionized water three times, and 500 ml of propylene glycol monomethyl ether acetate was added to substitute the solvent so as to obtain an alkali soluble resin (polyhydroxystyrene) having an Mw of 24,000. This alkali soluble resin was designated as resin A-1.

Synthesis Example 2

Synthesis of Resin A-2

57 g (0.6 mol) of metacresol, 38 g (0.4 mol) of paracresol, 75.5 g (0.93 mol of formaldehyde) of a 37 wt % aqueous solution of formaldehyde, 0.63 g (0.005 mol) of oxalic dihydrate and 264 g of methylisobutyl ketone were charged into a flask equipped with a cooling tube, stirrer and thermometer, and the flask was immersed in a oil bath to carry out polycondensation for 4 hours under agitation while the reaction solution was refluxed. The temperature of the oil bath was elevated over 3 hours, the pressure inside the flask was reduced to 30 to 50 mmHg to remove a volatile component, and the molten resin "a" was cooled to room temperature and recovered. This resin was dissolved in ethyl acetate to a resin content of 30%, and then methanol and water were added in amounts 1.3 times and 0.9 time the weight of the solution, respectively, and left to stand under agitation. The solution was separated into two layers, and the lower layer was taken out, concentrated and dried to obtain an alkali soluble resin (novolak resin) having an Mw of 8,000. This alkali soluble resin was designated as resin A-2.

Synthesis Example 3

5 parts by weight of 2,2'-azobis(2,4-dimethylvaleronitrile) and 200 parts by weight of propylene glycol monomethyl ether acetate were charged into a flask equipped with a cooling tube and stirrer. Subsequently, 25 parts by weight of styrene, 40 parts by weight of methacrylic acid and 30 parts by weight of dicyclopentanyl methacrylate were charged into the flask, the inside of the flask was substituted by nitrogen, 5 parts by weight of 1,3-butadiene was further charged and agitation was gently started. The solution was heated at 70° C. and maintained at that temperature for 4 hours to obtain a polymer solution containing a copolymer (A-3). The solid content of the obtained polymer solution was 33.5%.

Synthesis Example 4

7 parts by weight of 2,2'-azobis(2,4-dimethylvaleronitrile) and 200 parts by weight of propylene glycol monomethyl ether acetate were charged into a flask equipped with a cooling tube and stirrer. Subsequently, 10 parts by weight of styrene, 20 parts by weight of methacrylic acid, 45 parts by weight of glycidyl methacrylate and 25 parts by weight of dicyclopentanyl methacrylate were charged into the flask, the inside of the flask was substituted by nitrogen, and agitation was gently started. The solution was heated at 70° C. and maintained at that temperature for 5 hours to obtain a polymer solution containing a copolymer (A-4). The solid content of the obtained polymer solution was 33.5%.

Synthesis Example 5

7 parts by weight of 2,2'-azobis(2,4-dimethylvaleronitrile) and 200 parts by weight of propylene glycol monomethyl ether acetate were charged into a flask equipped with a cooling tube and stirrer. Subsequently, 20 parts by weight of styrene, 16 parts by weight of methacrylic acid, 19 parts by weight of dicyclopentanyl methacrylate, 45 parts by weight of β-methylglycidyl methacrylate and 3 parts by weight of α-methylstyrene dimer were charged into the flask, the inside of the flask was substituted by nitrogen, and agitation was gently started. The solution was heated at 70° C. and maintained at that temperature for 5 hours to obtain a polymer solution containing a copolymer (A-5). The obtained polymer solution had a solid content of 33.3% and the obtained polymer had a weight average molecular weight of 12,000 (weight average molecular weight is a molecular weight in terms of polystyrene measured by GPC (Gel Permeation Chromatography) (HLC-8020 of Tosoh Corporation)).

Synthesis Example 6

7 parts by weight of 2,2'-azobis(2,4-dimethylvaleronitrile) and 200 parts by weight of diethylene glycol methyl ethyl ether were charged into a flask equipped with a cooling tube and stirrer. Subsequently, 5 parts by weight of styrene, 16 parts by weight of methacrylic acid, 34 parts by weight of dicyclopentanyl methacrylate, 40 parts by weight of glycidyl methacrylate and 3 parts by weight of α-methylstyrene dimer were charged into the flask, the inside of the flask was substituted by nitrogen, 5 parts by weight of 1,3-butadiene was further added, and agitation was gently started. The solution was heated at 70° C. and maintained at that temperature for 5 hours to obtain a polymer solution containing a copolymer (A-6). The obtained polymer solution had a solid content of 33.1% and the obtained polymer had a weight average molecular weight of 10,000.

Synthesis Example 7

7 parts by weight of 2,2'-azobis(2,4-dimethylvaleronitrile) and 200 parts by weight of diethylene glycol methyl ethyl ether were charged into a flask equipped with a cooling tube and stirrer. Subsequently, 5 parts by weight of styrene, 16 parts by weight of methacrylic acid, 34 parts by weight of dicyclopentanyl methacrylate, 40 parts by weight of β-methylglycidyl methacrylate and 3 parts by weight of α-methylstyrene dimer were charged into the flask, the inside of the flask was substituted by nitrogen, 5 parts by weight of 1,3-butadiene was further added, and agitation was gently started. The solution was heated at 70° C. and maintained at that temperature for 5 hours to obtain a polymer solution containing a copolymer (A-7). The obtained polymer solution had a solid content of 33.1% and the obtained polymer had a weight average molecular weight of 9,000.

Synthesis Example 8

7 parts by weight of 2,2'-azobis(2,4-dimethylvaleronitrile) and 200 parts by weight of diethylene glycol methyl ethyl ether were charged into a flask equipped with a cooling tube and stirrer. Subsequently, 5 parts by weight of styrene, 16 parts by weight of methacrylic acid, 24 parts by weight of dicyclopentanyl methacrylate, 40 parts by weight of β-methylglycidyl methacrylate, 10 parts by weight of cyclohexylmaleimide and 3 parts by weight of α-methylstyrene dimer were charged into the flask, the inside of the flask was substituted by nitrogen, 5 parts by weight of 1,3-butadiene was further added, and agitation was gently started. The solution was heated at 70° C. and maintained at that temperature for 5 hours to obtain a polymer solution containing a copolymer (A-8). The obtained polymer solution had a solid content of 33.2% and the obtained polymer had a weight average molecular weight of 13,000.

Synthesis Example 9

7 parts by weight of 2,2'-azobis(2,4-dimethylvaleronitrile) and 200 parts by weight of diethylene glycol methyl ethyl ether were charged into a flask equipped with a cooling tube and stirrer. Subsequently, 10 parts by weight of styrene, 25 parts by weight of 4-vinylbenzoic acid, 40 parts by weight of 4-vinylbenzylglycidyl ether, 25 parts by weight of phenylmaleimide and 3 parts by weight of α-methylstyrene dimer were charged into the flask, the inside of the flask was substituted by nitrogen, and agitation was gently started. The solution was heated at 70° C. and maintained at that temperature for 5 hours to obtain a polymer solution containing a copolymer (A-9). The obtained polymer solution had a solid content of 33.2% and the obtained polymer had a weight average molecular weight of 19,000.

Example 1

Preparation of Radiation Sensitive Resin Composition 100 parts by weight of KAYARAD DPHA (of Nippon Kayaku Co., Ltd.) as the component (B), 5 parts by weight of 2,2'-bis(2-chlorophenyl)-4,4',5,5'-tetrakis(4-ethoxycarbonylphenyl)-1,2'-biimidazole, 5 parts by weight of 4,4'-bis(diethylamino)benzophenone and 10 parts by weight of 2-benzyl-2-dimethylamino-1-(4-morpholinophenyl)butan-1-one as the components (C) were added to a solution containing the resin A-1 obtained in Synthesis Example 1 (corresponding to 100 parts by weight of the resin A-1) and 5 parts by weight of γ-glycidoxypropyltrimethoxysilane was further added. The resulting solution was dissolved in propylene glycol monomethyl ether acetate to a solid content of 36 wt % and filtered with a Millipore filter having a pore diameter of 0.5 μm to prepare a radiation sensitive resin composition solution (S-1).

(I) Preparation of Barrier Ribs

The above composition solution (S-1) was applied to a glass substrate by a spinner and pre-baked on a hot plate at 90° C. for 3 minutes to form a 5 μm thick coating film.

The obtained coating film was exposed to ultraviolet radiation having an intensity of 10 mW/cm² at 365 nm through a 10 μm×10 μm pattern mask for 30 minutes. This exposure was carried out in an oxygen atmosphere (in the air). Thereafter, the exposed coating film was developed with a 0.1 wt % aqueous solution of tetramethylammonium hydroxide at 25° C. for 90 seconds and washed in running pure water for 1 minute. The formed barrier ribs were cured by heating in an oven at 220° C. for 60 minutes to obtain barrier ribs having a film thickness of 4.5 μm.

(II) Evaluation of Barrier Rib Form

The upper tapered angle of the sectional form of the barrier rib obtained in (I) above (angle formed by a straight line connecting the upper pattern edge and the lower pattern edge and the top side of the trapezoidal sectional form) was measured. This value is shown in Table 1. When this value is 15 to 70°, it can be said that the sectional form of the barrier rib is satisfactory.

(III) Evaluation of Heat Resistance

The barrier rib formed in (I) above was heated in an oven at 250° C. for 60 minutes. The dimensional change of the thickness of the film is shown in Table 1. When the dimensional change before and after heating is 5% or less, it can be said that the heat dimensional stability is satisfactory.

(IV) Evaluation of Adhesion

The adhesion of the barrier rib obtained in (I) above was evaluated by a tape peel test. The results are shown in Table 1. The evaluation result is expressed by the number of remaining barrier ribs out of 100 barrier ribs.

(V) Evaluation of Volatile Component

The volatile component of the barrier rib obtained in (I) above was evaluated by TDS (EMD-WA1000S of Denshi Kagaku Co., Ltd.) measurement. This measurement was carried out by elevating the temperature from 25° C. to 200° C. at a rate of 1° C./s. The results are shown in Table 1. The evaluation results are expressed as the amount (wt %) of the volatile component based on the barrier rib material for a substrate measuring 10 mm×10 mm×4.5 μm.

Example 2

A composition solution (S-2) was prepared and evaluated in the same manner as in Example 1 except that 20 parts by weight of 2-methyl-(4-methylthiophenyl)-2-morpholino-1-propan-1-one and 10 parts by weight of 2,4-diethylthioxanthone were used as the components (C) in place of 5 parts by weight of 2,2'-bis(2-chlorophenyl)-4,4',5,5'-tetrakis(4-ethoxycarbonylphenyl)-1,2'-biimidazole, 5 parts by weight of 4,4'-bis(diethylamino)benzophenone and 10 parts by weight of 2-benzyl-2-dimethylamino-1-(4-morpholinophenyl)butan-1-one. The results are shown in Table 1.

Example 3

A composition solution (S-3) was prepared and evaluated in the same manner as in Example 1 except that 10 parts by weight of 2-(4-methoxy-β-styryl)-bis(4,6-trichloromethyl)-s-triazine was used as the component (C). The results are shown in Table 1.

Example 4

A composition solution (S-4) was prepared and evaluated in the same manner as in Example 1 except that 20 parts by weight of 2-methyl-(4-methylthiophenyl)-2-morpholino-1-propan-1-one and 10 parts by weight of 4-N,N-diethylaminobenzophenone were used as the components (C). The results are shown in Table 1.

Example 5

A composition solution (S-5) was prepared and evaluated in the same manner as in Example 1 except that 5 parts by weight of 1,7-bis(4-hydroxy-3-methoxyphenyl)-1,6-heptadiene-3,5-dione was added as an ultraviolet light absorber. The results are shown in Table 1.

Example 6

A composition solution (S-6) was prepared and evaluated in the same manner as in Example 1 except that 5 parts by weight of dibenzylidene acetone was added as an ultraviolet light absorber. The results are shown in Table 1.

Example 7

A composition solution (S-7) was prepared and evaluated in the same manner as in Example 1 except that 20 parts by weight of hexamethoxymethylolmelamine was added as a crosslinking agent. The results are shown in Table 1.

Example 8

A composition solution (S-8) was prepared and evaluated in the same manner as in Example 1 except that 100 parts by weight of the copolymer (A-2) obtained in Synthesis Example 2 was used in place of the polymer solution of the copolymer (A-1). The results are shown in Table 1.

Example 9

A composition solution (S-9) was prepared and evaluated in the same manner as in Example 1 except that the polymer solution of the copolymer (A-3) obtained in Synthesis Example 3 was used in place of the polymer solution of the copolymer (A-1). The results are shown in Table 1.

Example 10

A composition solution (S-10) was prepared and evaluated in the same manner as in Example 1 except that the polymer solution of the copolymer (A-4) obtained in Synthesis Example 4 was used in place of the polymer solution of the copolymer (A-1). The results are shown in Table 1.

TABLE 1

|  | tapered angle | heat resistance (%) | adhesion | volatile component (%) |
| --- | --- | --- | --- | --- |
| Ex. 1 | 45 | −3 | 100 | 0.8 |
| Ex. 2 | 40 | −4 | 100 | 1.1 |
| Ex. 3 | 40 | −3 | 100 | 0.7 |
| Ex. 4 | 45 | −4 | 100 | 1.0 |
| Ex. 5 | 40 | −3 | 100 | 0.8 |
| Ex. 6 | 40 | −3 | 100 | 0.8 |
| Ex. 7 | 40 | −3 | 100 | 0.7 |
| Ex. 8 | 40 | −3 | 100 | 0.9 |
| Ex. 9 | 50 | −4 | 100 | 1.1 |
| Ex. 10 | 45 | −3 | 100 | 0.8 |

Ex.: Example

Example 11

100 parts by weight of KAYARAD DPHA (of Nippon Kayaku Co., Ltd.) as the component (B), 5 parts by weight of 2,2'-bis(2-chlorophenyl)-4,4',5,5'-tetrakis(4-ethoxycarbonylphenyl)-1,2'-biimidazole, 5 parts by weight of 4,4'-bis(diethylamino)benzophenone and 10 parts by weight of 2-benzyl-2-dimethylamino-1-(4-morpholinophenyl)butan-1-one as the components (C), 7 parts by weight of carbon black as the component (D), 2 parts by weight of an urethane-based dispersant (Disperbyk-182) and 5 parts by weight of γ-glycidoxypropyltrimethoxysilane were added to the polymer solution obtained in Synthesis Example 5 (corresponding to 100 parts by weight of the copolymer (A-5)). The resulting solution was dissolved in propylene glycol monomethyl ether acetate to a solid content of 36 wt % and filtered with a Millipore filter having a pore diameter of 2 μm to prepare a radiation sensitive resin composition solution (S-11). The radiation sensitive resin composition was evaluated in the same manner as in Example 1. The results are shown in Table 2.

The light screening properties of the resin composition was carried out as follows.
Evaluation of Light Screening Properties The OD value of a 4.5 μm thick film formed by the same process as in (I) of Example 1 was measured by an optical densitometer (Macbeth TR927 of Sakatainks Co., Ltd.) except that a mask was not used upon exposure. The results are shown in Table 2.

Example 12

A composition solution (S-12) was prepared and evaluated in the same manner as in Example 11 except that 16 parts by weight of C.I. Pigment Red 177, 7 parts by weight of C.I. Pigment Blue 15:4 and 6 parts by weight of an urethane-based dispersant (Disperbyk-182) were used as the components (D) in place of 7 parts by weight of carbon black. The results are shown in Table 2.

Example 13

A composition solution (S-13) was prepared and evaluated in the same manner as in Example 11 except that 20 parts by weight of 2-methyl-(4-methylthiophenyl)-2-morpholino-1-propan-1-one and 10 parts by weight of 2,4-diethylthioxanthone were used as the components (C) in place of 5 parts by weight of 2,2'-bis(2-chlorophenyl)-4,4',5,5'-tetrakis(4-ethoxycarbonylphenyl)-1,2'-biimidazole, 5 parts by weight of 4,4'-bis(diethylamino)benzophenone and 10 parts by weight of 2-benzyl-2-dimethylamino-1-(4-morpholinophenyl)butan-1-one. The results are shown in Table 2.

Example 14

A composition solution (S-14) was prepared and evaluated in the same manner as in Example 11 except that 10 parts by weight of 2-(4-methoxy-β-styryl)-bis(4,6-trichloromethyl)-s-triazine was used as the component (C) in place of 5 parts by weight of 2,2'-bis(2-chlorophenyl)-4,4',5,5'-tetrakis(4-ethoxycarbonylphenyl)-1,2'-biimidazole, 5 parts by weight of 4,4'-bis(diethylamino)benzophenone and 10 parts by weight of 2-benzyl-2-dimethylamino-1-(4-morpholinophenyl)butan-1-one. The results are shown in Table 2.

Example 15

A composition solution (S-15) was prepared and evaluated in the same manner as in Example 11 except that 20 parts by weight of 2-methyl-(4-methylthiophenyl)-2-morpholino-1-propan-1-one and 10 parts by weight of 4-N,N-diethylaminobenzophenone were used as the components (C) in place of 5 parts by weight of 2,2'-bis(2-chlorophenyl)-4,4',5,5'-tetrakis(4-ethoxycarbonylphenyl)-1,2'-biimidazole, 5 parts by weight of 4,4'-bis(diethylamino)benzophenone and 10 parts by weight of 2-benzyl-2-dimethylamino-1-(4-morpholinophenyl)butan-1-one. The results are shown in Table 2.

Example 16

A composition solution (S-16) was prepared and evaluated in the same manner as in Example 11 except that the polymer solution of the copolymer (A-6) obtained in Synthesis Example 6 was used in place of the polymer solution of the copolymer (A-5). The results are shown in Table 2.

Example 17

A composition solution (S-17) was prepared and evaluated in the same manner as in Example 11 except that the polymer solution of the copolymer (A-7) obtained in Synthesis Example 7 was used in place of the polymer solution of the copolymer (A-1). The results are shown in Table 2.

Example 18

A composition solution (S-18) was prepared and evaluated in the same manner as in Example 11 except that the polymer solution of the copolymer (A-8) obtained in Synthesis Example 8 was used in place of the polymer solution of the copolymer (A-1). The results are shown in Table 2.

Example 19

A composition solution (S-19) was prepared and evaluated in the same manner as in Example 11 except that the polymer solution of the copolymer (A-9) obtained in Synthesis Example 9 was used in place of the polymer solution of the copolymer (A-1). The results are shown in Table 2.

Example 20

A composition solution (S-20) was prepared and evaluated in the same manner as in Example 11 except that 37 parts by weight of C.I,. Pigment Red 177 and 16 parts by weight of C.I. Pigment Blue 15:4 were used as the components (D) and 12 parts by weight of an urethane-based dispersant (Disperbyk-182) was used. The results are shown in Table 2.

TABLE 2

|  | tapered angle | heat resistance (%) | light screening properties (OD) | adhesion |
|---|---|---|---|---|
| Ex. 11 | 45 | 3 | 1.1 | 100 |
| Ex. 12 | 40 | 4 | 1.0 | 100 |
| Ex. 13 | 40 | 3 | 1.0 | 100 |
| Ex. 14 | 45 | 4 | 1.0 | 100 |
| Ex. 15 | 40 | 4 | 1.0 | 100 |
| Ex. 16 | 45 | 4 | 1.0 | 100 |
| Ex. 17 | 50 | 4 | 1.0 | 100 |
| Ex. 18 | 45 | 3 | 1.0 | 100 |
| Ex. 19 | 40 | 2 | 1.0 | 100 |
| Ex. 20 | 50 | 3 | 1.9 | 100 |

Ex.: Example

According to the present invention, there is provided a radiation sensitive resin composition which is capable of forming barrier ribs having excellent properties such as inversely tapered form, heat resistance, low volatility and light screening properties with ease.

Highly reliable barrier ribs can be obtained from the above radiation sensitive resin composition.

What is claimed is:

1. A barrier rib for an EL display element which is formed from a radiation sensitive resin composition comprising (A) an alkali soluble resin selected from the group consisting of a novolak resin, a homopolymer of a radical polymerizable monomer having a phenolic hydroxyl group, a homopolymer of a radical polymerizable monomer have a carboxyl group, and an epoxy group-containing a copolymer of at least one unsaturated carboxylic monomer selected from the group consisting of an unsaturated carboxylic acid and an unsaturated carboxylic anhydride, an epoxy group-containing unsaturated monomer and another olefinic unsaturated monomer other than said at least one unsaturated carboxylic monomer and said epoxy-group-containing unsaturated monomer (B) a polymerizable compound having an ethylenically unsaturated bond, and (C) a radiation sensitive polymerization initiator, on a substrate, said barrier rib having a trapezoidal cross section form with a longer top side than the bottom side on the substrate and an angle formed by a straight line connecting the upper pattern edge and the lower pattern edge and the top side of 15 to 75°.

2. The barrier rib for an EL display element according to claim 1, wherein the resin composition contains a colorant.

3. The barrier rib for an EL display element according to claim 2, which has an optical density value of 0.1 or more with a film thickness of 1 µm.

4. An EL display element comprising the barrier ribs of claim 2.

5. The barrier rib for an EL display element according to claim 1, wherein a volatile component is present in the barrier rib in an amount of 10% or less of the weight of the barrier rib, the amount of said volatile compound being determined by elevating the temperature of said barrier rib from 25° C. to 200° C. at a rate of 1° C./s.

6. The barrier rib for an EL display element according to claim 5, wherein the volatile component is 5% or less of the weight of the barrier rib.

7. The barrier rib for an EL display element according to claim 5, wherein the volatile component is 2% or less of the weight of the barrier rib.

8. The barrier rib for an EL display element according to claim 5, wherein the volatile component is 1% or less of the weight of the barrier rib.

9. An EL display element comprising the barrier ribs of claim 1.

10. The barrier rib from an EL display element according to claim 1, wherein said angle is from 40 to 50°.

* * * * *